United States Patent [19]

Goto

[11] Patent Number: 5,198,857
[45] Date of Patent: Mar. 30, 1993

[54] FILM EXPOSURE APPARATUS AND METHOD OF EXPOSURE USING THE SAME

[75] Inventor: Manabu Goto, Yokohama, Japan

[73] Assignee: Ushio Denski Kabushiki Kaisha, Tokyo, Japan

[21] Appl. No.: 671,534

[22] Filed: Mar. 19, 1991

[30] Foreign Application Priority Data

Mar. 30, 1990 [JP] Japan .................................. 2-81336

[51] Int. Cl.$^5$ ............................................ G03B 27/42
[52] U.S. Cl. ..................................... 355/53; 355/40; 355/41
[58] Field of Search ............................... 355/53, 41, 40

[56] References Cited

U.S. PATENT DOCUMENTS

| | | |
|---|---|---|
| 3,689,991 | 9/1972 | Aird . |
| 4,109,158 | 8/1978 | Blitchington et al. . |
| 4,435,076 | 3/1984 | Tatsunosuke .................. 355/53 |
| 4,855,792 | 8/1989 | Holbrook et al. ................. 355/53 |

FOREIGN PATENT DOCUMENTS

298362/89 12/1989 Japan .
2-141760 5/1990 Japan .
87/00444 1/1988 PCT Int'l Appl. .

Primary Examiner—Monroe H. Hayes
Attorney, Agent, or Firm—Oliff & Berridge

[57] ABSTRACT

In a film exposure apparatus and method of exposure using the same which are disclosed herein, a plurality of frames arranged in a longitudinal direction of a belt-shaped film are exposed sequentially to light for transcript of an image onto each of the frames. The film exposure apparatus comprises an illumination system, a photomask disposed at a location to which light from the illumination system is applied, a photomask position adjusting mechanism, a projection lens of projecting an image of the photomask irradiated, and a film feed mechanism for step-feeding the film one frame by one frame. The belt-shaped film is provided with at least two or more film-side alignment marks on each frame, and the photomask is provided with a circuit pattern whose image is to be projected and transferred onto the film, and photomask-side alignment marks in correspondence to the film-side alignment marks.

15 Claims, 6 Drawing Sheets

FILM EXPOSURE APPARATUS AND METHOD OF EXPOSURE USING THE SAME

TECHNICAL FIELD

This invention relates to a film exposure apparatus and method of exposure using the same suitable for fabrication of a film circuit board.

BACKGROUND ART

There is a conventionally known photolithographic technology for applying a fine working on a surface of an object. In addition to a semiconductor integrated circuit, recently, this technology is also applied to fabrication of a film circuit board for use in mounting of electronic parts in a tape automated bonding (TAB) technology.

However, a misalignment of a circuit pattern to be transferred will result in a mis-mounting in the case of the circuit board. For this reason, it is necessary to effect an alignment, so that an image of a pattern of a photomask is formed at a correct position. The alignment accuracy is needed to be within, for example, ±10 $\mu$m.

The alignment in the prior art is accomplished in the following manner: First, prior to exposure, an exposure specimen having an alignment mark is placed onto a stage. Then, light from a lamp is applied through a photomask having an alignment mark to be projected. Then, both of the alignment mark on the exposure specimen and the projected image of the photomask-side alignment mark are observed by a microscope.

A photomask position adjusting mechanism is operated so that the image of the photomask-side alignment mark is aligned with the alignment mark on the exposure specimen, thereby achieving the alignment.

In order to correctly locate one frame of the film at an image plane of a projection lens, the film feeding distance is previously set, and the feeding direction is improved by a sprocket roller disposed in front of the image plane. Further, after the film has been fed by the previously set distance, the stage having a locating pin is raised relative to one frame of the film stopped, and the locating pin is fitted into a perforation in the film. The alignment relative to the image plane in a direction of the optical axis is achieved through the aid of a retaining plate for retaining one frame of the film pushed up from the below by the stage.

In this way, in the alignment in the prior art, the photomask is located at a correct position through the aid of the exposure specimen prior to starting of the operation of exposure apparatus. In operation, one frame of the film is merely located at a correct position by the feed roller. In other words, no feed-back control is carried out for the film during exposure.

SUMMARY OF THE INVENTION

However, there is a limit of the accuracy in such a mechanical alignment by the sprocket roller, the locating pin and the like. The alignment accuracy, for example, within about 10 $\mu$m or less can be no longer achieved.

This may be caused, for example, by the fact that a belt-shaped long film may be slightly zigzag rather than completely rectilinear. In such a case, even if the film is intended to be forcedly transported straightly by the sprocket roller, the film may be transported with a misalignment more than an acceptable limit.

In addition, the locating pin provided on the stage is forcedly fitted into the perforation to effect the positioning. However, if the film is transported with a misalignment, the perforation may be damaged into an enlarged size, resulting in a reduced positioning accuracy.

Further, there is a tendency to use thinner films. If the thickness is of 30 $\mu$m or less, the positioning method using the locating pin can be no longer employed from a severe problem.

It is an object of this invention to provide a film exposure apparatus and method of exposure using the same, wherein an image can be projected at a correct position, while eliminating the need of fitting of the locating pin into the perforation, thereby providing a further high accuracy of the position for transferring an image of a pattern by exposure.

To achieve the above object, according to this invention, there is provided a film exposure apparatus in which a plurality of frames arranged in a longitudinal direction of a belt-shaped film are exposed sequentially to light for transcript of an image onto each of the frames, comprising an illumination system, a photomask disposed at a location which is irradiated by light from the illumination system, a photomask position adjusting mechanism, a projection lens for projecting an image of the photomask irradiated, and a film feed mechanism for step-feeding the film one frame by one frame, wherein the belt-shaped film is provided with at least two or more film-side alignment marks on each frame, and the photomask is provided with a circuit pattern whose image is to be projected and transferred onto the film, and photomask-side alignment marks in correspondence to the film-side alignment marks.

In the film exposure apparatus of this invention, it is desirable that the film-side alignment mark is comprised of a hole or a transparent portion formed in the film.

In addition, it is desirable that the apparatus includes an optical system for projecting again a primary projection image of the photomask-side alignment mark projected to a position of projection of the image by the projection lens, and a detector adapted to receive a secondary projection image provided by the optical system.

Further, it is desirable that the apparatus includes a second optical system for projecting a primary projection image of the photomask-side alignment mark in a divided manner even to a position different from a position at which the detector is mounted, an image sensor adapted to receiving a secondary projection image provided by the second optical system, and a monitor mechanism associated with the image sensor.

In addition, according to this invention, there is provided a film exposure method which is carried out by the abovedescribed film exposure apparatus, comprising the steps of detecting by the detecting system whether or not each of the film-side alignment marks has reached a position to which the image of corresponding one of the photomask-side alignment mark is projected, when such frame of the film has been stepfed by the film feed mechanism, stopping such one frame by a signal from the detecting system, and effecting an exposure.

Further, according to this invention, there is provided a film exposure method comprising the steps of step-feeding one frame of a film by the film feed mechanism, driving the photomask position adjusting mechanism to control the position of the photomask, so that the image of each of the photomaskside alignment marks to the position of corresponding one of the film-side alignment marks on the one frame stopped after the step-feeding, and effecting an exposure.

Yet further, according to this invention, there is provided a film exposure method which is carried out by the above-described film exposure apparatus, comprising the steps of step-feeding one frame of a film by the film feed mechanism, driving the photomask position adjusting mechanism after step-feeding, thereby scanning a primary projection image of each of the photomask-side alignment marks in a region including corresponding one of the film-side alignment marks on the stopped one frame, while permitting light transmitted through the film-side alignment marks to be applied to the detector, storing positions at equal output levels in rising and falling curves of an output signal from the detector, driving the photomask position adjusting mechanism, so that an image of each of the photomask-side alignment marks may be aligned with corresponding one of the film-side alignment marks on the basis of the stored positions, and effecting an exposure.

The above and other objects, features and advantages of the invention will become apparent from the following description of the preferred embodiments, taken in conjunction with the accompanying drawings.

DESCRIPTION OF PREFERRED AND VARIOUS MODES FOR CARRYING OUT INVENTION

Figure 1:
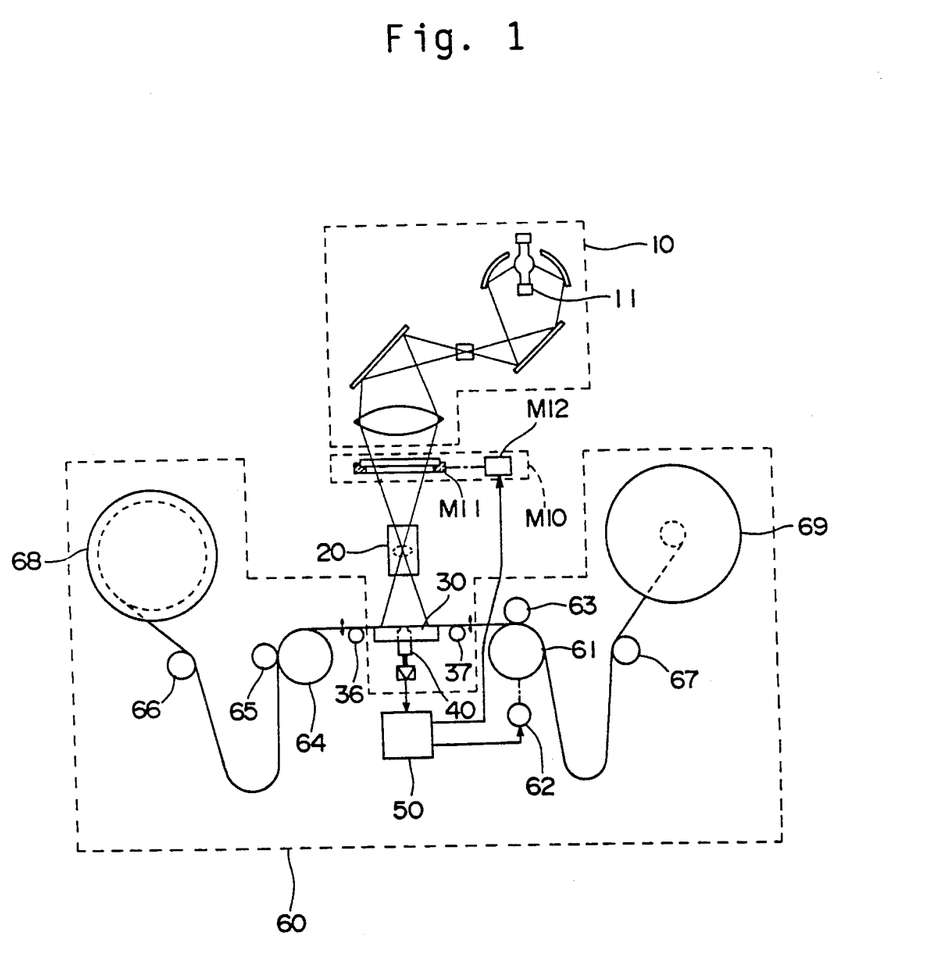
FIG. 1 is a side view of a film exposure apparatus according to one embodiment of this invention.

FIG. 1 is an illustration of a film exposure apparatus according to one embodiment of this invention. The apparatus is intended to expose a belt-shaped film F to transfer a circuit pattern of a photomask M thereon sequentially in a longitudinal direction of the film F.

Referring to FIG. 1, illumination system 10 is provided with a lamp 11 which efficiently emits light of a wavelength sensitive by a resist, such as a ultra-high pressure mercury lamp.

The illumination system 10 is also provided with a filter shiftably disposed to changeover light of an exposure wavelength and light of an alignment wavelength, so that shifting of the filter permits the light of alignment wavelength to be applied onto the photomask M during alignment, and permits the light of the exposure wavelength to be applied onto the film during exposure.

The filter used may be, for example, a low wavelength cut filter which cuts off light of 500 nm or less sensitive by the resist. During exposure, the low wavelength cut filter is retreated from an optical path.

Figure 2:
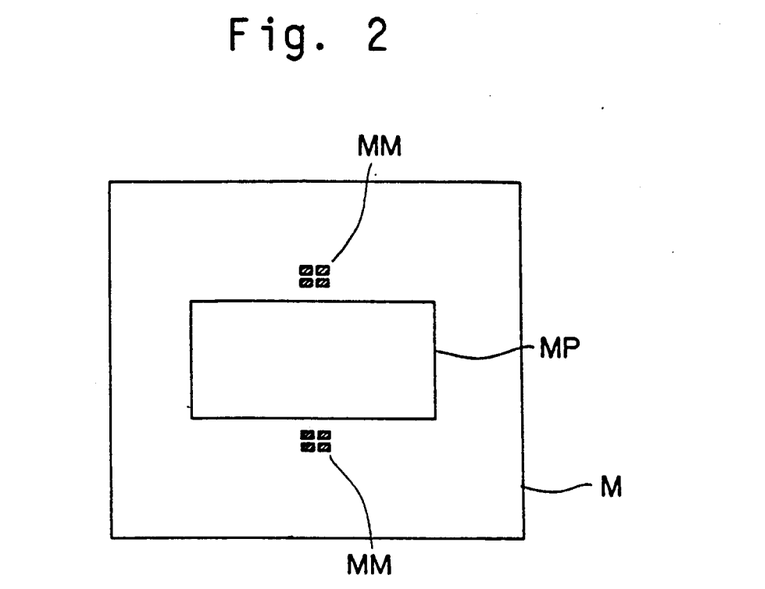
FIG. 2 is a diagram illustrating photomask-side alignment marks.

The photomask M is disposed at a location to which light from the illumination system 10 is applied. As shown in FIG. 2, the photomask M is provided with a photomask-side alignment mark (which will be referred to as a photomask-side mark hereinafter) MM in correspondence to a film-side alignment mark (which will be referred to as a film-side mark hereinafter) FM. The photomask M is also provided with a circuit pattern MP whose image is to be transferred onto the film F. The photomask-side mark is formed with a cross-shaped transparent portion included in an opaque square portion.

Figure 3:
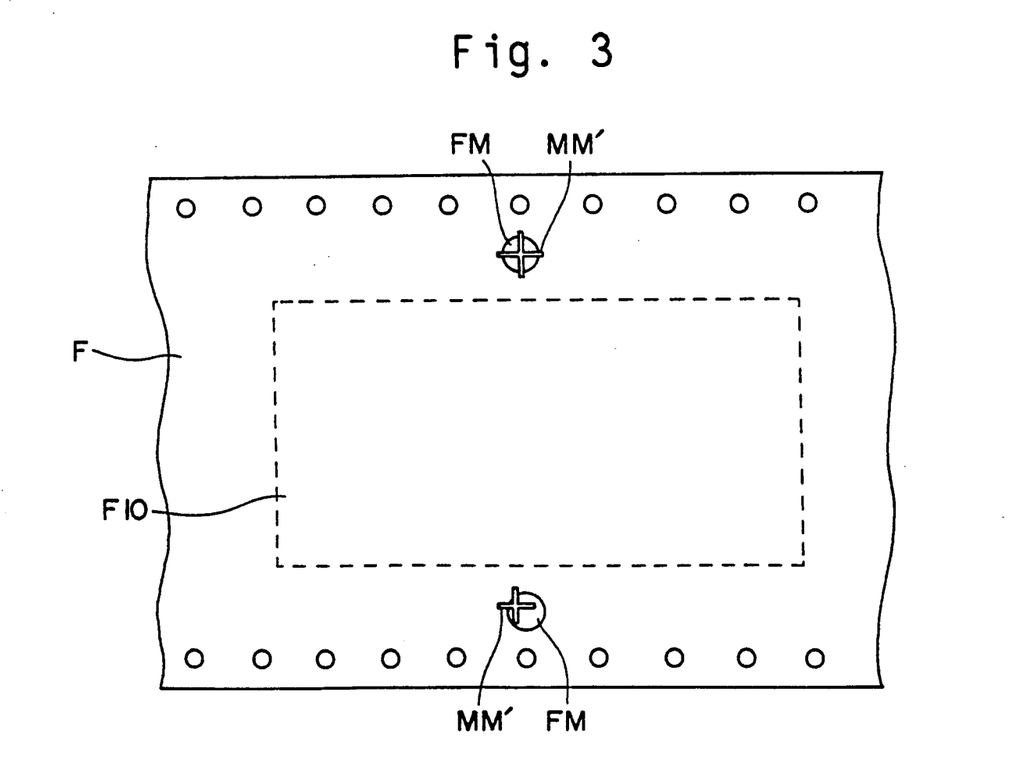
FIG. 3 is a diagram illustrating film-side marks.

Referring to FIG. 3, the belt-shaped film F is provided with two film-side marks FM for every one frame F10. In this embodiment, the film-side mark FM is rounded hole.

The image MM' of the photomask-side mark is scanned, with movement of the photomask M, on an area of the one frame including the film-side mark FM, i.e., on an upper surface of the film F at a location to which an image is projected by a projecting lens and on a phantom plane FK of the film-side mark FM comprised of the hole.

In this embodiment, each pair of the two film-side marks FM and the two photomask-side marks MM are provided in a widthwise direction of the film F, but the location and number of these marks are not limited thereto.

A photomask position adjusting mechanism M10 is provided with a photomask holder M11 and a servomotor M12. When the servomotor M12 is driven in response to a signal from a system controller 50, the photomask holder M11 is moved, so that the photomask M is subjected to a follow-up control. The photomask holder M11 is capable of adjusting the positions of the photomask in two directions perpendicular to each other in a plane perpendicular to an optical axis (i.e., in X and Y directions), and also capable of adjustment in which the photomask M is rotated about the optical axis (i.e., adjustment in $\theta$ direction). Thus, in practice, the three servomotors M12 for driving the photomask holder M11 are provided so that the photomask holder M11 can be driven in the X, Y and $\theta$ directions.

A projection lens 20 projects the image of the photomask M. Line widths in the range of 5 $\mu$m have to be imaged by this projection lens.

The stage 30 is provided with a vacuum-attracting hole 31 which is adapted to blow out air during step-feeding of the film F and to vacuum-attract the film during exposure. Reference numeral 32 is a vacuum pump, and 34 is a valve. In this embodiment, the vacuum pump 31 also serves for ejecting air to float up the film F in step-feeding.

Reference numeral 33 is compressor, and 35 is a valve. Reference numerals 36 and 37 are means for floating up front and back portions of the film F in step-feeding. The valves 34 and 35 are controlled by a signal from the system controller 50.

Figure 4:
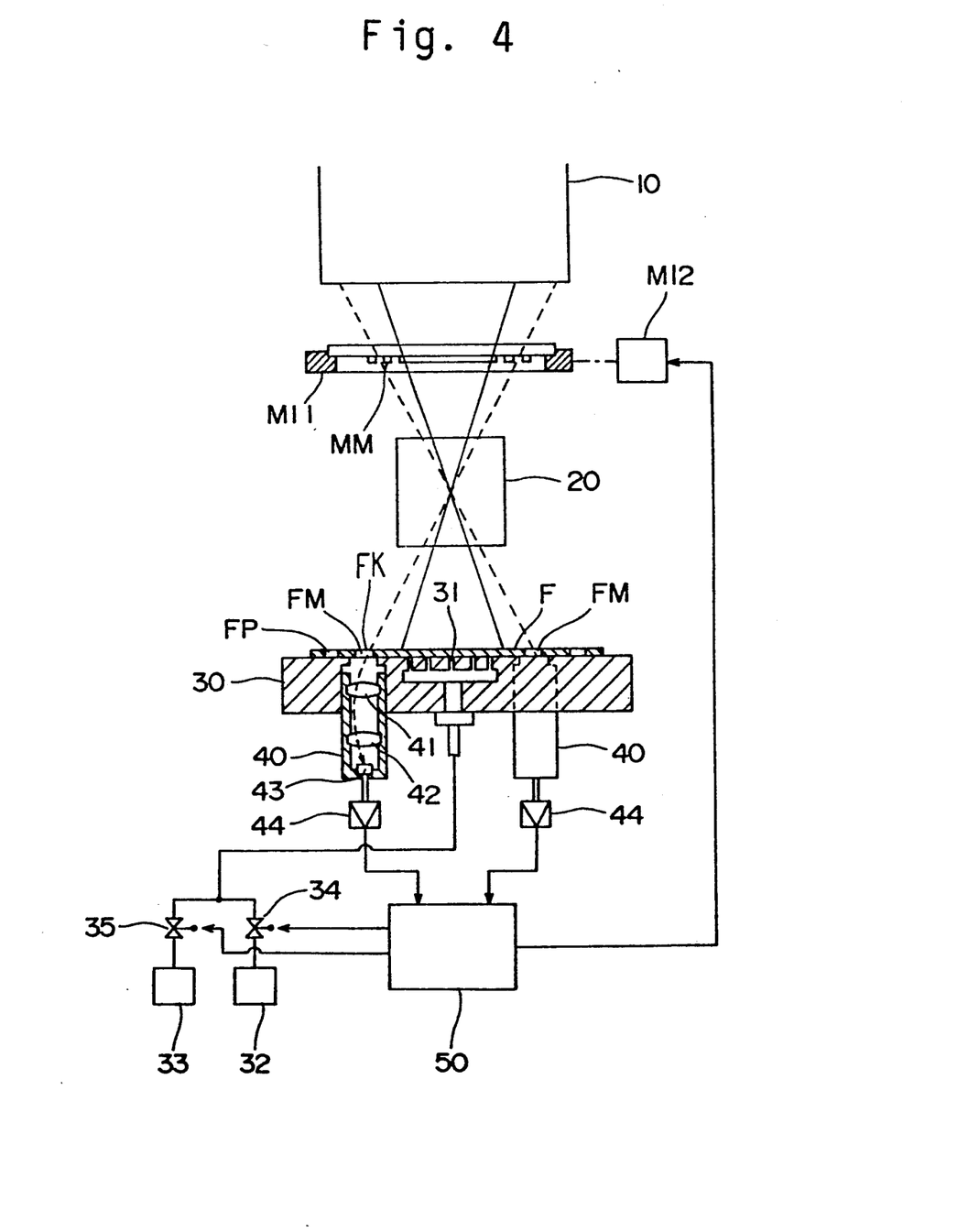
FIG. 4 is a view of an essential portion of the film exposure apparatus shown in FIG. 1, taken in a film feeding direction.

Referring to FIG. 4, a detecting system 40 is unit type which is provided with an objective lens 41, a condenser lens 42, and a dector 43. In this embodiment, the detecting system 40 is embedded in the stage 30, with the objective lens 41 which faces the film-side mark FM. The detector 43 is photoelectric transducer having a high sensitivity, e.g., a phototube or a photodiode. Alternatively, an image sensor can be used as the detector 43. Reference numeral 44 is an amplifier.

A system controller 50 includes a CPU.

A film feed mechanism 60 feeds one frame F10 of the film F to a position to which the image is projected by the projecting lens 20. A feed roller 61 is driven by a motor 62, and then stopped by a signal from the system controller 50 which has received a signal from the detecting system 40. Reference numeral 63 is a retaining roller; 64 being a sprocket roller; 65 is a retaining roller; 66 and 67 being each an auxiliary roller; 68 being an unwind reel; and 69 being a wind-up reel.

When one frame F10 of a film F is step-fed by the film feed mechanism 60, the detector 40 detects whether or not each of the film-side mark FM has reached a position to which the image of corresponding one of the photomask-side mark MM is projected.

Figure 5:
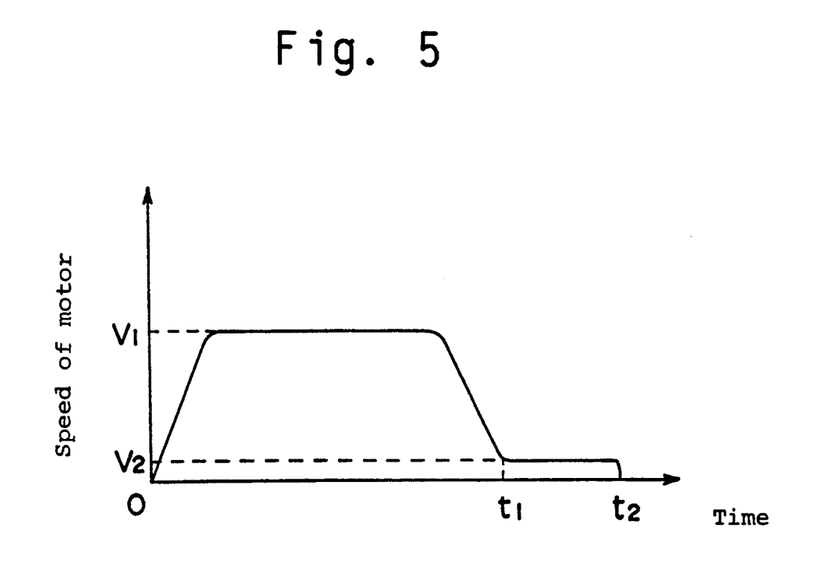
FIG. 5 is a graph illustrating a profile of speed of a motor.

First, the motor 62 is started to rotate at a speed V1 by starting signal from the system controller 50 as shown in FIG. 5, and after the passage of time period and at a time t1, the motor speed is reduced to a level V2. The time t1 has been previously set depending upon the length of one frame F10 of the film.

With the speed reduced, the motor 62 is stopped by a stopping signal from the system controller 50 which has processed a signal from the detector 40. This time point is t2 shown in FIG. 5.

The generation of the stopping signal by the system controller 50 is carried out in the following manner: As shown in FIG. 3, when one frame F10 has been fed and each of the film-side marks Fm have reached the position to which is projected the image of corresponding one of the photomask-side marks MM, the detector 40 produces a signal in response to light for alignment (which is shown by a dotted line in FIG. 4) transmitted through the film-side marks FM.

As shown in FIG. 4, the two detecting systems 40 are provided in the widthwise direction of the film F. Two signals are supplied to the system controller 50. However, signals from the two detecting systems 40 are supplied with a slight time lag, because the film F feeding is meandering.

Figure 6:
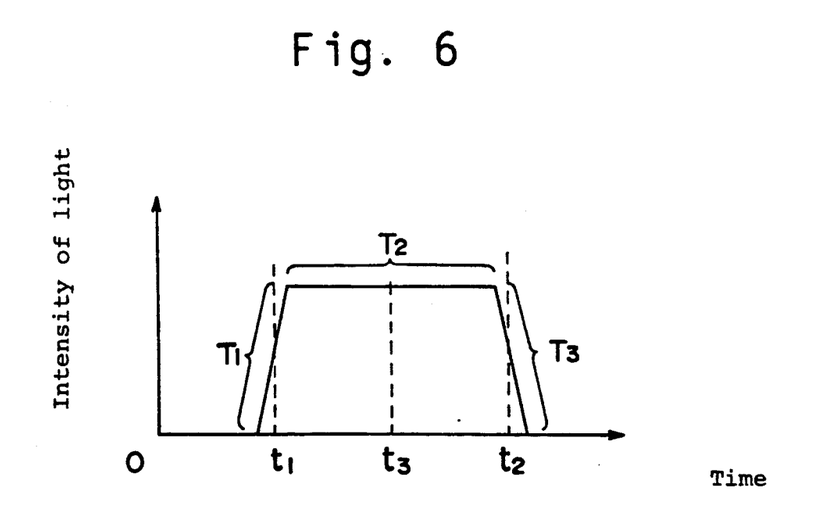
FIG. 6 is a diagram of a waveform of a detection signal.

In this embodiment, the signal is processed by the system controller 50, so that the stopping signal may be delivered during a time period (T3 in FIG. 6) of falling of the signal received late in the system controller 50 from the detecting system 40, thereby completely stopping the motor 62 (at t2 in FIG. 6).

Because the motor 60 is stopped by the signal from the detector system 40 after reducing the speed, the stopped position is vary accurate.

When one frame F10 has been stopped by the stopping signal from the system controller 50, a signal is supplied from the system controller 50 to the valves 34 and 35, thereby turning the compressor 33 OFF, while turning the vacuum pump 32 ON thereby attracting the one frame F10 to the stage 30.

In this condition, the position of the photomask M is aligned in order to effect an exposure with a high accuracy. More specifically, the photomask position adjusting mechanism M10 is driven so that the images of the photomask-side marks FM are projected onto the positions of the corresponding film-side marks FM of the one frame F10, respectively. The photomask M is aligned, while the position of the photomask M is being moved in the X and Y directions and rotated about the optical axis.

In detail, when the position of the photomask M is scanned in the X direction (the feeding direction), an electric signal produced in the detecting system 40 is, as shown in FIG. 6, of a pulse-like waveform comprised of a rising portion T1 in which the image of the photomask-side mark MM begins to be superposed on the film-side mark FM, a flat portion T2 in which the superposed area between the images of the photomask-side marks and the film-side marks is substantially constant, and a falling portion T3 in which the position of the image of the photomask-side mark MM begins to be misaligned from the film-side mark FM.

Thereupon, the optimal position at which the photomask M is finally stopped in the X direction is determined at a position at a time t3 corresponding to, for example, a central point of the flat portion T2 having the maximum superposed area. Thus, an information of the position of the photomask M and a value of the signal from the detecting system 40 at that time are stored in the system controller 50. Then, such information and value are processed by the system controller 50 to determine an optimal position for the photomask M in the X direction.

In the same manner, the photomask M is also scanned in the Y direction to produce a signal in the detecting system 40, an optimal position for the photomask M in the Y direction is determined by processing of the signal in the system controller 50, and a driving signal is delivered to the servomotor M12 for driving the photomask in the Y direction.

The adjustment of the position in the X or Y direction is conducted using either one of the detecting system 40. After the adjustments of the positions in the X and Y directions have been completed, the photomask M is rotated about the optical axis, while receiving the signal from the other detecting system 40. In this case, the signal from the other detecting system 40 is of a form similar to that shown in FIG. 6. Hence, an optimal position for the photomask M in the rotational direction ($\theta$ direction) is determined by an information of an angle of rotation of the photomask M and a value of the signal from the detecting system 40, and a driving signal is delivered to the servomotor M12 for driving the photomask in the $\theta$ direction. In this manner, the adjustment of the positions of the photomask M in the X, Y and $\theta$ directions is achieved.

After completion of the alignment in the above manner, the low wavelength cut filter is retreated so that exposure light is emitted from the illumination system 10, thereby effecting the exposure of one frame F10 at the projected position to the light to transfer the circuit pattern MP of the photomask M on the one frame F10.

Referring to another embodiment of this invention, the signal is processed by the system controller 50, so that a stopping signal is produced at a time (T1 in FIG. 6) of rising of a signal late received therein from the detecting system 40.

Figure 9:
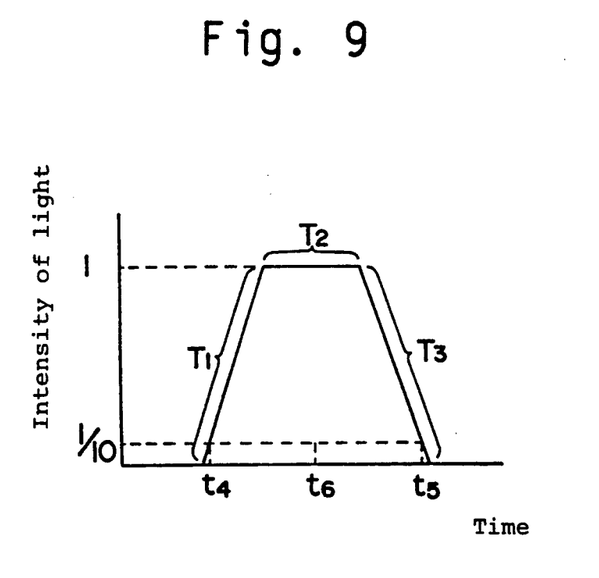
FIGS. 9 and 10 are diagrams of waveforms of a detection signal, respectively.

The alignment of the photomask M after step-feeding is carried out in the following manner:

The photomask position adjusting mechanism M10 is driven to scan a primary projected image of the photomask MM in area including the film-side mark FM and to cause the detector 43 to receive light transmitted through the film-side mark FM. Positions at an equal output level in rising and falling curves of an output signal from the detector 43, e.g., positions t4 and t5 at a time when an output equal to 1/10 of an output value at T2 in FIG. 9 has been detected, are stored, and the photomask position adjusting mechanism M10 is driven, so that the photomask is stopped on the basis of the stored positions, for example, at a middle position t6 between t4 and t5.

Figure 7:
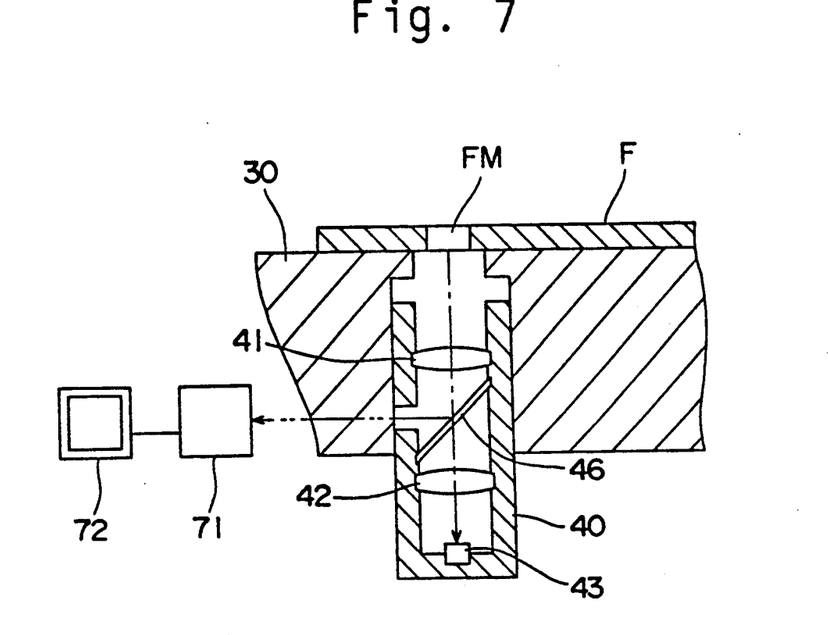
FIG. 7 is a sectional view of one embodiment of a detecting system.

Referring to another embodiment of this invention, the film exposure apparatus comprises, as shown in FIG. 7, a second optical system is provided with a beam splitter 46, an image sensor 71 which receives a secondary image from the secondary optical system, and a monitor mechanism 72 associated with the image sensor 71.

The image of the photomask-side mark MM can be monitored, so that an operator can visually confirm whether or not correct alignment is achieved.

Although the embodiments of this invention have been described above, it will be understood that various modifications and variations can be made to this invention in the following manner:

(1) The film-side mark FM is not limited to the hole and may be a mark comprising a light-transmittable film or the like affixed to a hole. With such a construction, there is not arisen a problem due to the incorporation of dusts into the detecting system 40.

Figure 8:
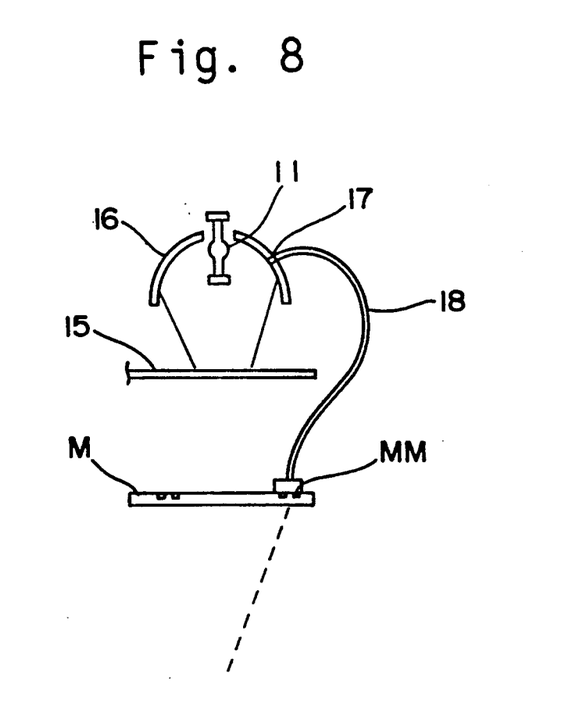
FIG. 8 is a view of one example for applying light from an illumination system to the photomask-side alignment marks.

(2) The exposure light may be used as alignment light without any low wavelength cut filter as shown in FIG. 8. In FIG. 8, 16 shows a reflector, 17 a hole, 18 an optical fiber.

In addition, various modifications and variations can be made even to the film exposure method of this invention in the following manner:

(1) If the construction is such that the motor 62 is stopped, without use of the signal from the detecting system 40, after the one frame F10 is fed by a predetermined distance, the alignment of the photomask M may be conducted after the stoppage of the motor 62. And the alignment of the photomask M may be conducted, for example, for every ten frames, rather than for every one frame.

Figure 10:
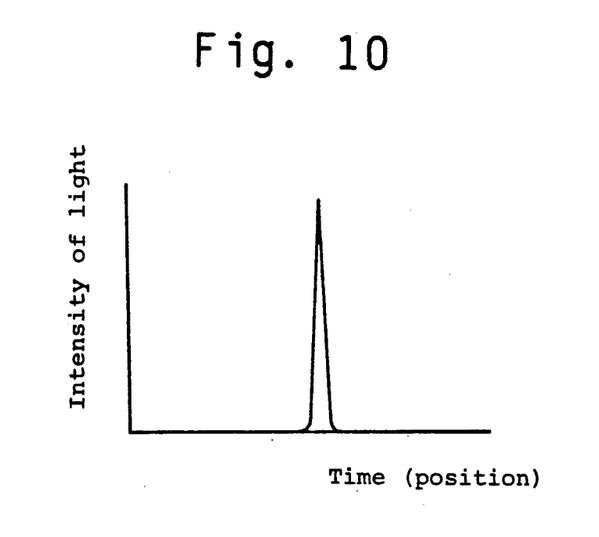

(2) When the alignment of the photomask M is conducted, it is possible to predict the falling of the signal from the detection system 40, if the film-side mark FM is of a complete circle. This ensures that if the radius of such complete circle has been previously stored in the system controller 50, the position of the photomask M can be controlled only by detecting the time of rising. In addition, if the size of the film-side mark FM is extremely small, the detection signal is of a shape having a peak as shown in FIG. 10 and hence, the position of the photomask may be controlled according to the position corresponding to the peak in no consideration of rising and falling positions of the detection signal.

In the film exposure apparatus of this invention, at least two or more photomask-side marks are formed on the photomask, while film-side marks corresponding to the photomask-side marks are formed on one frame of the film and therefore, an exposure of higher accuracy can be carried out by aligning the photomask-side and film-side marks with each other.

Especially, in the apparatus comprising an optical system which projects again a primary projection image of each of the photomask-side alignment marks, and a detector which receives a secondary projection image from the optical system, a more appropriate alignment can be achieved.

What is claimed is:

1. A film exposure apparatus in which a plurality of frames arranged in a longitudinal direction of a belt-shaped film are exposed sequentially to light for formation of an image onto each of the frames the film exposure apparatus comprising:
   an illumination system;
   a photomask disposed at a location to which light from the illumination system is applied;
   a photomask position adjusting mechanism;
   a projection lens for projecting an image of the photomask formed by said light; and
   a film feed mechanism for step-feeding the film one frame by one frame, wherein;
   said belt-shaped film is provided with at least two film-side alignment marks on each frame, said film-side alignment marks being formed by at least one of a hole and a transparent portion formed in the film; and
   said photomask is provided with a circuit pattern, whose image is to be projected and transferred onto the film, and with photomask-side alignment marks to be projected in correspondence to the film-side alignment marks, said apparatus further comprising an optical system for projecting a secondary projection image of a primary projection image of at least one of the photomask-side alignment marks to a position of projection of the alignment mark image by the projection lens, and a detector adapted to receive the secondary projection image provided by said optical system.

2. The film exposure apparatus according to claim 1, further comprising:
   a detecting system for detecting whether or not each of the film-side alignment marks on one frame of a film has reached a position to which the image of a corresponding ne of the photomask-side alignment marks is projected, when such frame the film has been step-fed by the film feed mechanism;
   stopping means for stopping such one frame by a signal from the detecting system; and
   exposure means for effecting an exposure.

3. The film exposure apparatus according to claim 1, wherein:
   the film feed mechanism step-feeds one frame of the film;
   driving means drives the photomask position adjusting mechanism to align the photomask, so that the image of each of the photomask-side alignment marks is projected to a position of a corresponding one of the film-side alignment marks on the one frame stopped after the sep-feeding; and
   exposure means effects an exposure.

4. The film exposure apparatus according to claim 1, wherein:
   the film feed mechanism step-feeds one frame of the film;
   driving means drives the photomask position adjusting mechanism after step-feeding, thereby scanning a primary projection image of each of the photomask-side alignment marks in a region including a corresponding one of the film-side alignment marks on the stepped one frame, while permitting light transmitted through the film-side alignment marks to be applied to the detector;
   position storing means stores positions at equal output levels in rising and falling curves of an output signal from the detector;
   driving means drives the photomask position adjusting mechanism so that an image of each of the photomaskside alignment marks may be aligned with a corresponding one of the film-side alignment marks on the basis of the stored positions; and exposure means effects an exposure.

5. The film exposure apparatus according to claim 1, further comprising a second optical system for projecting a primary projection image of said at least one photomask-side alignment mark in a divided manner to a position different from a position at which the detector is mounted, an image sensor adapted to receive a secondary projection image provided by the second optical system, and a monitor mechanism associated with the image sensor.

6. A film exposure apparatus in which a plurality of frames arranged in a longitudinal direction of a belt-shaped film are exposed sequentially to light for formation of an image onto each of the frames, the film exposure apparatus comprising:

an illumination system;
a photomask disposed at a location to which light from the illumination system is applied;
a photomask position adjusting mechanism;
a projection lens for projecting an image of the photomask formed by said light; and
a film feed mechanism for step-feeding the film one frame by one frame, said film feed mechanism step-feeding one frame of the film, wherein;
said belt-shaped film is provided with at least two film-side alignment marks on each frame, said film-side alignment marks being formed by at least one of a hole and a transparent portion formed in the film;
said photomask is provided with a circuit pattern, whose image is to be projected and transferred onto the film, and with photomask-side alignment marks to be projected in correspondence to the film-side alignment marks; and
the photomask position adjusting mechanism is driven to align the photomask, so that the image of each of the photomask-side alignment marks is projected to the position of a corresponding one of the film-side alignment marks on the one frame stopped after the step-feeding, said apparatus further comprising exposure means for effecting an exposure.

7. The film exposure apparatus according to claim 6, further comprising:

a detecting system for detecting whether or not each of the film-side alignment marks on one frame of a film has reached a position to which the image of a corresponding one of the photomask-side alignment marks is projected when such frame of the film has been step-fed by the film feed mechanism;
stopping means for stopping such one frame by a signal from the detecting system; and
exposure means for effecting an exposure.

8. The film exposure apparatus according to claim 6, further comprising an optical system for projecting a secondary projection image of a primary projection image of at least one of the photomask-side alignment marks to a position of projection of the alignment mark image by the projection lens, and a detector adapted to receive the secondary projection image provided by said optical system.

9. The film exposure apparatus according to claim 8, wherein:

the film feed mechanism step-feeds one frame of the film;

driving means drives the photomask position adjusting mechanism after step-feeding, thereby scanning a primary projection image of each of the photomask-side alignment marks in a region including a corresponding one of the film-side alignment marks on the stepped one frame, while permitting light transmitted through the film-side alignment marks to be applied to the detector;
position storing means stores positions at equal output levels in rising and falling curves of an output signal from the detector;
driving means drives the photomask position adjusting mechanism so that an image of each of the photomaskside alignment marks may be aligned with corresponding one of the film-side alignment marks on the basis of the stored positions; and
exposure means effects an exposure.

10. The film exposure apparatus according to claim 8, further including a second optical system for projecting a primary projection image of the photomask-side alignment mark in a divided manner to a position different from a position at which the detector is mounted, an image sensor adapted to receive a secondary projection image provided by the second optical system, and a monitor mechanism associated with the image sensor.

11. A film exposure apparatus in which a plurality of frames arranged in a longitudinal direction of a belt-shaped film are exposed sequentially to light for formation of an image onto each of the frames, the film exposure apparatus comprising:

an illumination system;
a photomask disposed at a location to which light from the illumination system is applied;
a photomask position adjusting mechanism;
a projection leans for projecting an image of the photomask formed by said light; and
a film feed mechanism for step-feeding the film one frame by one frame, said film feed mechanism step-feeding one frame of the film, wherein:
said belt-shaped film is provided with at least two film-side alignment marks on each frame, said film-side alignment marks being formed by at least one f a hole and a transparent portion formed in the film;
said photomask is provided with a circuit pattern, whose image is to be projected and transferred onto the film, and with photomask-side alignment marks to be projected in correspondence to the film-side alignment marks; and
the photomask position adjusting mechanism is driven to align the photomask, so that the image of each of the photomask-side alignment marks is projected to the position of a corresponding one of the film-side alignment marks on the one frame stopped after the step-feeding, said apparatus further comprising:
exposure mean for effecting an exposure;
an optical system for projecting a secondary projection image of a primary projection image of at least one of the photomask-side alignment marks to a position of projection of the alignment mark image by the projection lens; and
a detector adapted to receive the secondary projection image provided by said optical system.

12. The film exposure apparatus according to claim 11, further comprising:

a detecting system for detecting whether or not each of the film-side alignment marks on one frame of a film has reached a position to which the image of a corresponding one of the photomask-side alignment marks is projected, when such frame of the film has been step-fed by the film feed mechanism;

stopping means for stopping such one frame by a signal from the detecting system; and exposure means for effecting an exposure.

13. The film exposure apparatus according to claim 11, wherein:

the film feed mechanism step-feeds one frame of the film;

driving means drives the photomask position adjusting mechanism after step-feeding, thereby scanning a primary projection image of each of the photomask-side alignment marks in a region including a corresponding one of the film-side alignment marks on the stepped one frame, while permitting light transmitted through the film-side alignment marks to be applied to the detector;

position storing means stores positions at equal output levels in rising and falling curves of an output signal from the detector;

driving means drives the photomask position adjusting mechanism so that an image of each of the photomaskside alignment marks may be aligned with a corresponding one of the film-side alignment marks on the basis of the stored positions; and exposure means effects an exposure.

14. The film exposure apparatus according to claim 13, further including a second optical system for projecting a primary projection image of the photomask-side alignment mark in a divided manner to a position different from a position at which the detector is mounted, an image sensor adapted to receive a secondary projection image provided by the second optical system, and a monitor mechanism associated with the image sensor.

15. The film exposure apparatus according to claim 11, further including a second optical system for projecting a primary projection image of the photomask-side alignment mark in a divided manner to a position different from a position at which the detector is mounted, an image sensor adapted to receive a secondary projection image provided by the second optical system, and a monitor mechanism associated with the image sensor.

* * * * *